US011056325B2

(12) United States Patent
Nguyen et al.

(10) Patent No.: US 11,056,325 B2
(45) Date of Patent: Jul. 6, 2021

(54) METHODS AND APPARATUS FOR SUBSTRATE EDGE UNIFORMITY

(71) Applicant: APPLIED MATERIALS, INC., Santa Clara, CA (US)

(72) Inventors: Thanh X. Nguyen, Fremont, CA (US);
Alexander Jansen, Sunnyvale, CA (US); Yana Cheng, San Jose, CA (US); Randal Schmieding, Saratoga, CA (US); Yong Cao, San Jose, CA (US); Xianmin Tang, San Jose, CA (US); William Johanson, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 415 days.

(21) Appl. No.: 16/215,769

(22) Filed: Dec. 11, 2018

(65) Prior Publication Data

US 2019/0189407 A1 Jun. 20, 2019

Related U.S. Application Data

(60) Provisional application No. 62/607,989, filed on Dec. 20, 2017.

(51) Int. Cl.
*H01J 37/34* (2006.01)
*C23C 14/34* (2006.01)
*C23C 14/54* (2006.01)
*H01J 37/32* (2006.01)

(52) U.S. Cl.
CPC ............ *H01J 37/347* (2013.01); *C23C 14/34* (2013.01); *C23C 14/3492* (2013.01); *C23C 14/545* (2013.01); *H01J 37/32651* (2013.01); *H01J 37/3447* (2013.01)

(58) Field of Classification Search
None
See application file for complete search history.

(56) References Cited

U.S. PATENT DOCUMENTS

| | | | |
|---|---|---|---|
| 7,544,270 B2 | 6/2009 | Wege et al. | |
| 7,981,262 B2 | 7/2011 | Pavloff et al. | |
| 8,865,012 B2 | 10/2014 | Ge et al. | |
| 8,999,106 B2 | 4/2015 | Liu et al. | |
| 9,315,891 B2 | 4/2016 | Lee et al. | |
| 2007/0209931 A1 | 9/2007 | Miller | |
| 2008/0152838 A1 | 6/2008 | Sen et al. | |
| 2014/0366912 A1 | 12/2014 | Green et al. | |
| 2016/0056024 A1* | 2/2016 | Johanson | H01J 37/32733 204/192.12 |
| 2017/0002461 A1 | 1/2017 | Johanson et al. | |

OTHER PUBLICATIONS

International Search Report and Written Opinion dated Apr. 5, 2019 for PCT Application No. PCT/US2018/065412.

* cited by examiner

*Primary Examiner* — Jason Berman
(74) *Attorney, Agent, or Firm* — Moser Taboada

(57) ABSTRACT

A movable substrate support with a top surface for holding a substrate, when present, is used in conjunction with a cover ring that is stationary to adjust for a shadow effect to control substrate edge uniformity during deposition processes. The cover ring is held stationary by an electrically isolated spacer that engages with a grounded shield in the process volume of a semiconductor process chamber. A controller adjusts the substrate support in response to deposition material on a top surface of the cover ring to maintain the shadow effect and substrate edge uniformity.

20 Claims, 6 Drawing Sheets

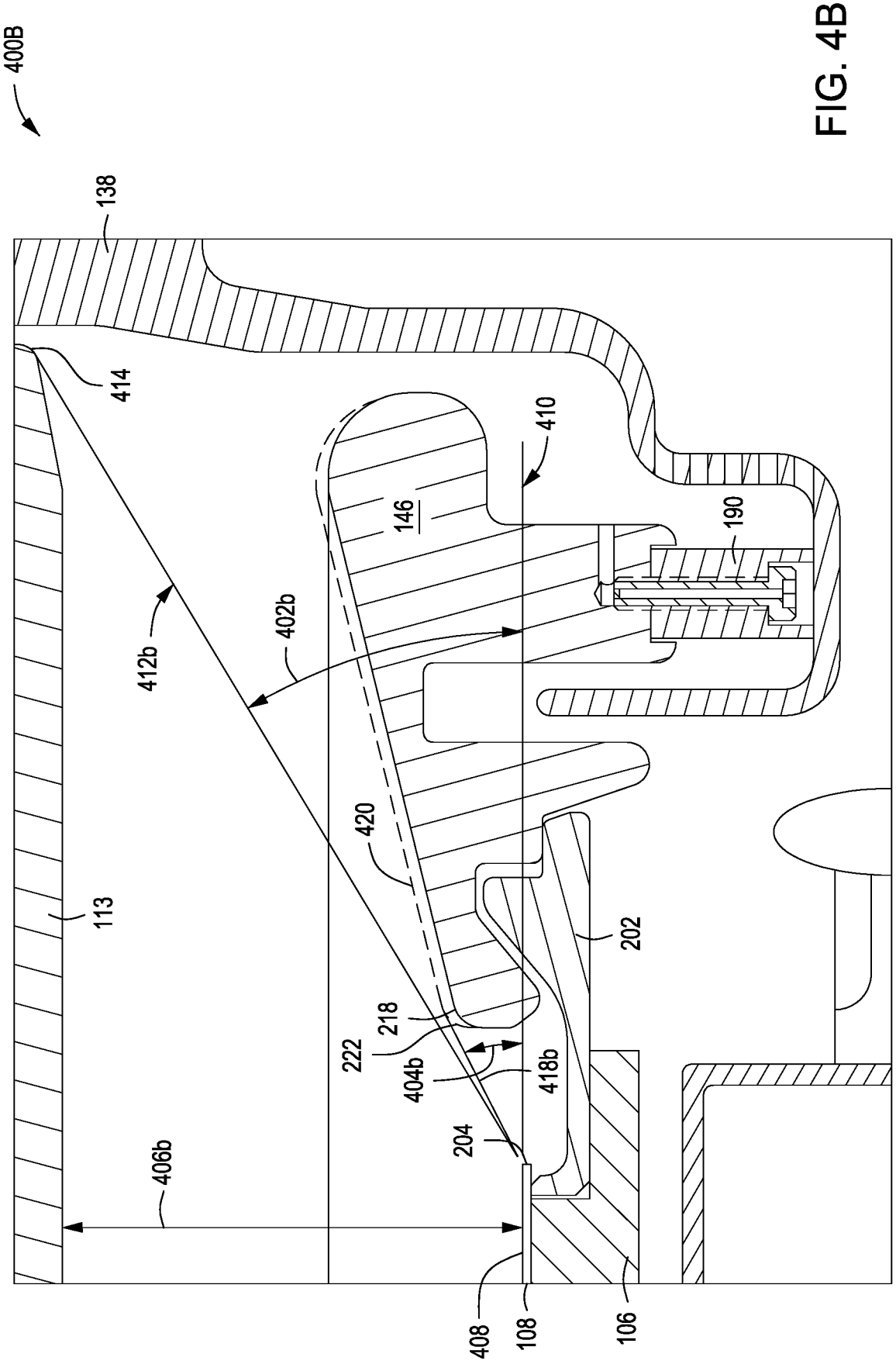

METHODS AND APPARATUS FOR SUBSTRATE EDGE UNIFORMITY

CROSS-REFERENCE TO RELATED APPLICATIONS

This application claims benefit of U.S. provisional patent application Ser. No. 62/607,989, filed Dec. 20, 2017 which is herein incorporated by reference in its entirety.

FIELD

Embodiments of the present principles generally relate to semiconductor processes.

BACKGROUND

Some substrate process chambers utilize a process kit that includes a grounded shield surrounding the interior volume of the process chamber. The process kit may also include a deposition ring that surrounds a substrate support and a cover ring that rests on the deposition ring. The cover ring is disposed between the grounded shield and the deposition ring to help seal the processing volume from the rest of the chamber. The process chamber may have a sputtering target that is powered by RF and/or DC power to deposit the target material on a wafer. During the sputtering processes, the target sputtering causes a deposition buildup on the process kit which, in turn, affects deposition uniformity on a wafer.

Therefore, the inventors have provided improved methods and apparatus for controlling the edge deposition uniformity on a substrate as the cover ring ages.

SUMMARY

Methods, apparatus, and systems provide control of substrate edge uniformity in semiconductor process chambers by maintaining a shadow effect in relation to an edge of a substrate.

In some embodiments, a method of controlling substrate edge uniformity in a semiconductor process chamber comprises depositing a first material on a first substrate disposed on a substrate support held in a first position relative to a cover ring disposed about the substrate support, the first positon providing a shadow angle of the cover ring to the first substrate and depositing the first material on a subsequent, second substrate with the substrate support in a second position relative to the cover ring, different than the first position, the second position maintaining the shadow angle of the cover ring for the second substrate, compensating for deposition on a top surface of the cover ring.

In some embodiments, the method may further comprise vertically raising the substrate support to compensate for deposition on the top surface of the cover ring; determining a thickness of deposition on the top surface of the cover ring and moving the substrate support in response to the thickness of deposition on the top surface of the cover ring; determining the thickness of deposition on the top surface of the cover ring by weighing the cover ring; determining, in kilowatt-hours, a usage of a sputtering target used in the semiconductor process chamber and moving the substrate support in response to the kilowatt-hours of the usage of the sputtering target; moving the substrate support to compensate for deposition on the top surface of the cover ring after a substrate is processed; and/or adjusting the substrate support based on a lookup table.

In some embodiments, an apparatus for controlling substrate edge uniformity in a semiconductor process chamber comprises a substrate support with a top surface for holding a substrate when present; the substrate support being movable; a cover ring that engages with an electrically insulating spacer that engages with a grounded shield such that the cover ring is held stationary; and a controller that maintains a shadow effect of the cover ring on the substrate by adjusting the substrate support.

In some embodiments, the apparatus may further comprise wherein the controller maintains the shadow effect by adjusting the substrate support in response to deposition of material on a top surface of the cover ring; wherein the controller adjusts the substrate support upward in response to the deposition of material on the top surface of the cover ring; wherein the controller adjusts the substrate support in response to a number of kilowatt-hours of usage of a sputtering target used in a deposition process; wherein the controller adjusts the substrate support in response to an increase in weight of the cover ring; wherein the shadow effect on a peripheral edge of the substrate controls deposition uniformity on the peripheral edge; and/or wherein the controller adjusts the substrate support after a substrate is processed.

In some embodiments, the apparatus can further comprise wherein the controller adjusts the substrate support upward in response to the deposition of material on a top surface of the cover ring; wherein the controller adjusts the substrate support in response to a number of kilowatt-hours of usage of a sputtering target used in a deposition process; wherein the controller adjusts the substrate support in response to an increase in weight of the cover ring; wherein the cover ring provides a shadow effect on a peripheral edge of the substrate when present to control deposition uniformity on the peripheral edge; wherein the controller adjusts the substrate support to compensate for the deposition of material on the surface of the cover ring to maintain the shadow effect of the cover ring during deposition; or wherein the controller adjusts the substrate support after a substrate is processed.

In some embodiments, a system for controlling substrate edge uniformity in a semiconductor process chamber comprises a process volume in the semiconductor process chamber; a shield surrounding the process volume and electrically grounded; a substrate support with a top surface for holding a substrate when present; the substrate support being movable; a deposition ring surrounding the substrate support; a cover ring that engages with an electrically insulating spacer that engages with the shield such that the cover ring is held stationary, the cover ring is isolated from the deposition ring and electrically isolated from the shield; and a controller that adjusts the substrate support in response to a deposition of material on a surface of the cover ring.

In some embodiments, the system further comprises wherein the cover ring forms a shadow effect on a periphery edge of the substrate when present; wherein the controller adjusts the substrate support to maintain the shadow effect when deposition on a top surface of the cover ring increases the shadow effect of the cover ring; wherein the deposition ring does not engage with the cover ring during deposition; wherein the electrically insulating space engages with a u-shaped portion of the shield; or wherein the controller continually adjusts the substrate support in response to the deposition of material on the surface of the cover ring.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 4B depicts a second position of a substrate support and shadow effects from a cover ring on a peripheral edge of a substrate in accordance with some embodiments of the present principles.

Figure 1:
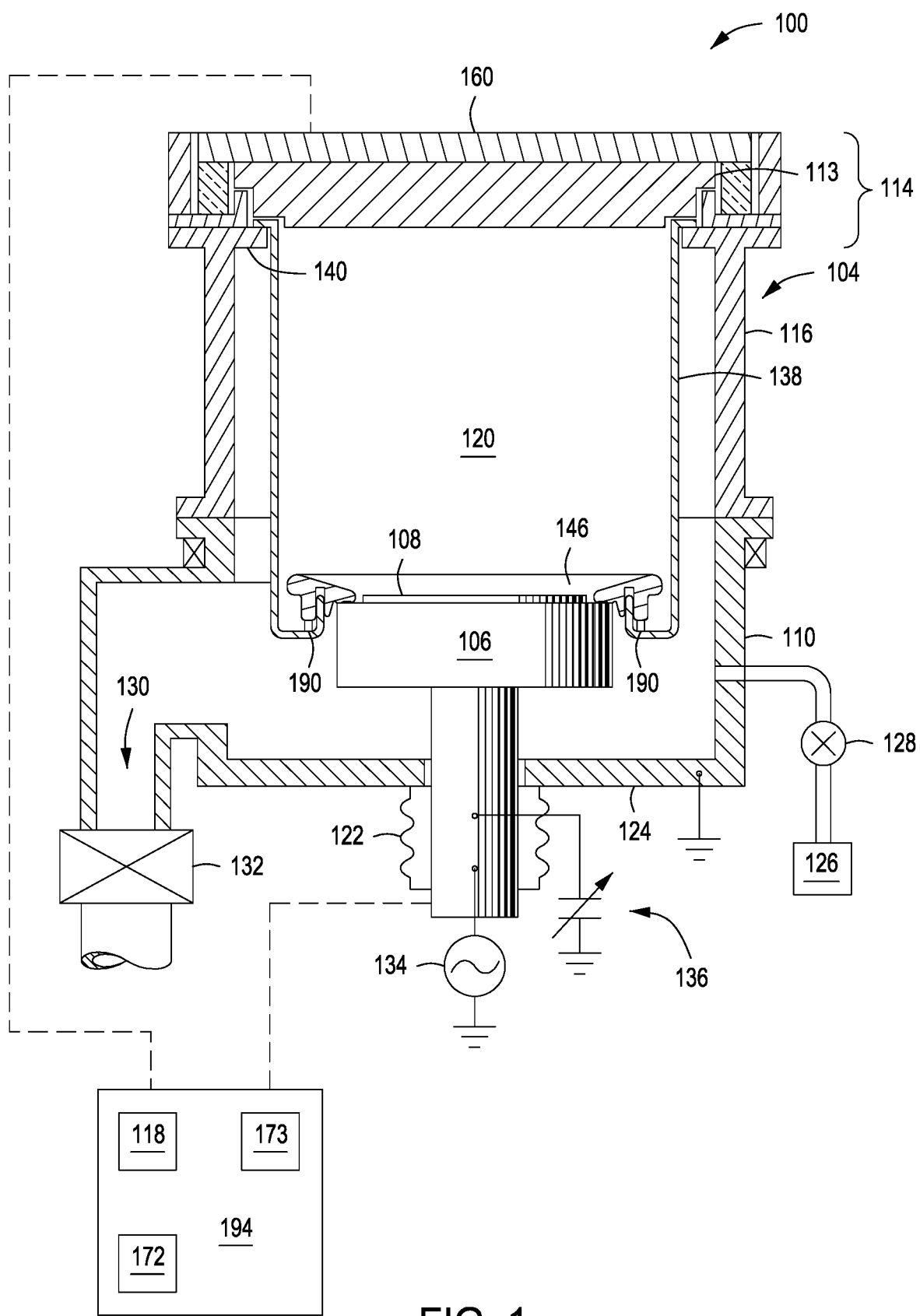
FIG. 1 depicts a schematic view of part of a process chamber suitable for performing a method for processing a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Some processes used for depositing a film on substrates use a sputtering target to create the deposition film. The deposition layer formed by the sputtering occurs much faster at low pressures than at high pressures. A high chamber pressure, for example—200 mTorr or more, causes a substantial increase in ion fraction during sputtering. With a higher ion ratio, a bias voltage can be applied more effectively to densify the deposition film. However, the high pressure also causes non-uniformity issues during the deposition process, especially at the edge of a substrate. The high pressures can cause an increase in the deposition of material on the process kit used in a semiconductor process chamber. The inventors have discovered that the high pressure target sputtering directly affects the edge uniformity of the substrate during deposition due to deposition buildup on the cover ring.

The inventors have developed methods and apparatus to advantageously compensate for the deposits on the cover ring to allow control over the edge uniformity of the substrate during target sputtering. The cover ring provides shadowing of the substrate edge during processing. The shadowing is kept consistent by maintaining the relative positions between the cover ring and substrate edge. When the deposition increases on the top surface of the cover ring, the amount of shadowing also increases and causes thinning of the deposition on the substrate's edge. To advantageously maintain the substrate edge uniformity, the substrate support is raised while the cover ring remains stationary to compensate for the added height of the cover ring due to deposition. The cover ring remains independent and free from contact of any deposition ring surrounding the substrate support. The cover ring may be held stationary by an electrically insulated spacer placed on the grounded shield inside the process chamber. Since the cover ring is stationary and does not contact the deposition ring, the grounded shield, or the substrate support, particle creation caused by a moving cover ring is advantageously reduced.

FIG. 1 depicts a simplified, cross-sectional view of a substrate processing system (e.g., physical vapor deposition (PVD) processing system 100) in accordance with some embodiments. For illustration, the PVD processing system 100 includes a target assembly 114. The process chamber 104 contains a substrate support 106 for receiving a substrate 108 thereon. The substrate support 106 may be located within a lower grounded enclosure wall 110, which may be a chamber wall of the process chamber 104. An RF power source (not shown) may provide RF energy to the target assembly 114. Alternatively or in combination a DC power source may be similarly coupled to target assembly 114.

In FIG. 1, the substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a process volume 120 of the process chamber 104. The process volume 120 is defined as the volume above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In some embodiments, RF power may be supplied in a range from about 2 kW to about 20 kW. In some embodiments, DC power may be supplied in range from about 2 kW to about 40 kW. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be used.

The process chamber 104 further includes a process kit shield, or grounded shield, 138 to surround the processing volume 120 of the process chamber 104 and to protect other chamber components from damage and/or contamination from processing. In some embodiments, the grounded shield 138 may be connected to a ledge 140 of an upper grounded enclosure wall 116 of the process chamber 104. Similar to the lower grounded enclosure wall 110, the upper grounded enclosure wall 116 may provide a portion of the RF return path between the lower grounded enclosure wall 116 and a grounding assembly of a chamber lid (not shown). However, other RF return paths are possible, such as via the grounded shield 138.

The grounded shield 138 extends downwardly and may include a generally tubular portion having a generally constant diameter that generally surrounds the process volume 120. The grounded shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the grounded shield 138). A cover ring 146 rests on a spacer 190 on the bottom of the u-shaped portion of the grounded shield 138. The spacer 190 is formed of a dielectric material to electrically isolate the cover ring 146 from the grounded shield 138. An additional deposition ring (not shown) may be used to protect the edges of the substrate support 106 from deposition around the edge of the substrate 108.

The target assembly 114 includes a sputtering target 113 of a material to be deposited on a substrate, such as the substrate 108 during sputtering. The material of the sputtering target 113 can include, for example, a metal, a metal oxide, a metal alloy, or the like. In some embodiments, the sputtering target 113 may be titanium-based, tantalum-based, or tungsten-based material, or the like. The sputtering target 113 may be disposed on a substrate support facing side of a backing plate 160. The backing plate 160 may comprise a conductive material, such as copper-zinc, copper-chrome, or the same material as the target, such that RF and DC power can be coupled to the sputtering target 113 via the backing plate 160. Alternatively, the backing plate 160 may be non-conductive and may include conductive elements (not shown) such as electrical feedthroughs or the like. The backing plate 160 may be disc shaped, rectangular, square, or any other shape that may be accommodated by the PVD processing system 100. The backing plate 160 is configured to support the sputtering target 113 such that a front surface of the sputtering target opposes the substrate 108 when present. The sputtering target 113 may be coupled to the backing plate 160 in any suitable manner. For example, in some embodiments, the sputtering target 113 may be diffusion bonded to the backing plate 160.

The PVD processing system 100 may have an RF power source (not shown) that may include an RF generator and a matching circuit, for example, to minimize reflected RF energy reflected back to the RF generator during operation. For example, RF energy supplied by the RF power source may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source (not shown) to provide additional energy to the target assembly 114 during processing. In some embodiments, the second energy source may be a DC power source to provide DC energy, for example, to enhance a sputtering rate of the target material (and hence, a deposition rate on the substrate). In some embodiments, the second energy source may be a second RF power source, similar to the RF power source, to provide RF energy, for example, at a second frequency different than a first frequency of RF energy provided by the RF power source. In embodiments where the second energy source is a DC power source, the second energy source may be coupled target assembly 114 in any location suitable to electrically couple the DC energy to the target assembly 114.

A controller 194 may be provided and coupled to various components of the PVD processing system 100 to control the operation thereof (e.g., controlling the substrate support 106 vertical motion, controlling power supplied to the sputtering target 113, etc.). The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods may be stored in the memory 172 as software routine that may be executed or invoked to control the operation of the PVD processing system 100 in the manner described herein. The software routine may also be stored and/or executed by a second CPU (not shown) that is remotely located from the hardware being controlled by the CPU 118.

Figure 2:
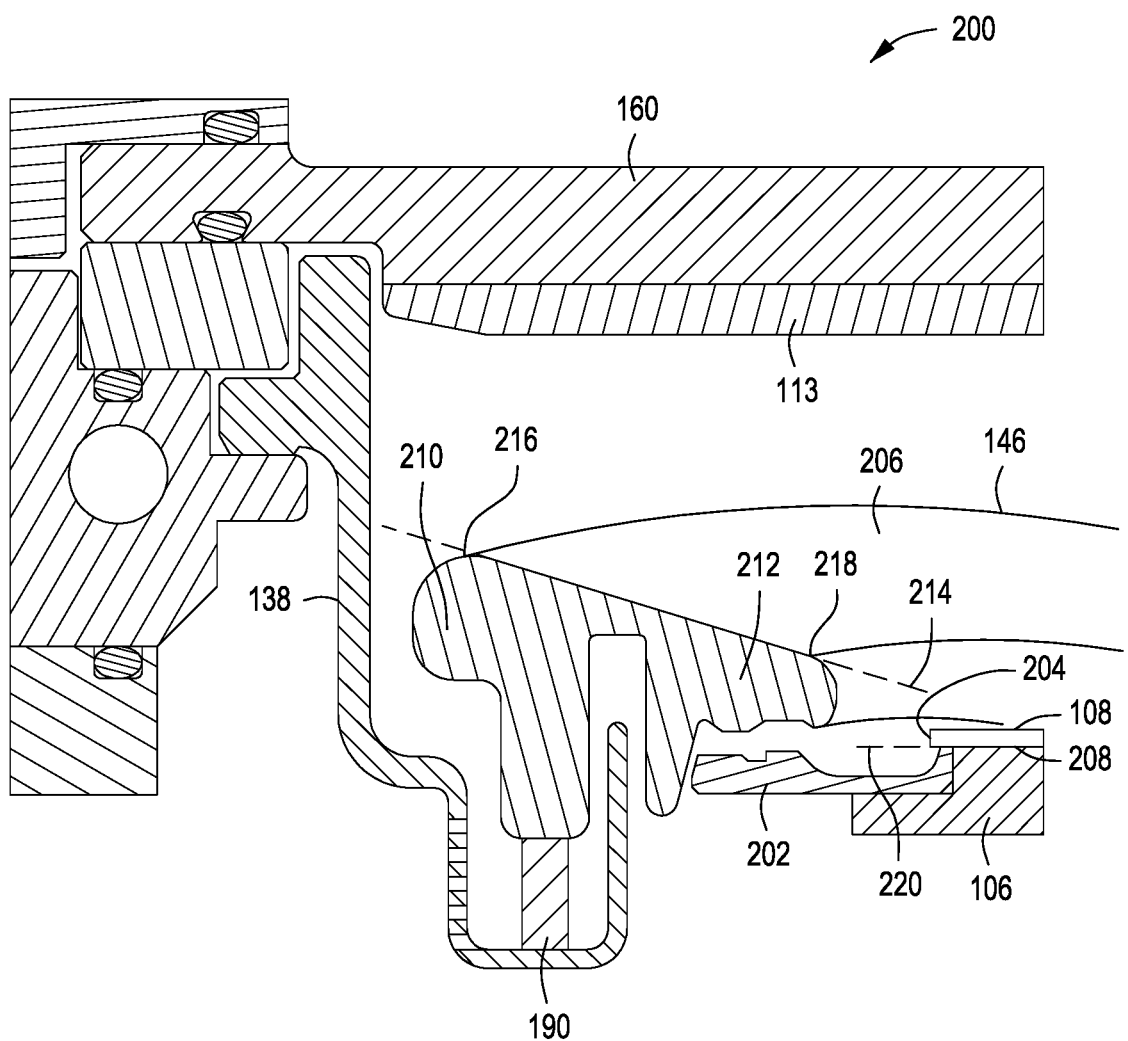
FIG. 2 depicts a schematic view of part of a process kit used in a process chamber in accordance with some embodiments of the present principles.

FIG. 2 is shows part of a process kit 200 that can be used in the PVD processing system 100 of FIG. 1. The cover ring 146 rests on the spacer 190 that electrically insulates the cover ring 146 from the grounded shield 138. The cover ring 146 is allowed to float electrically. The spacer 190 holds the cover ring 146 stationary and away from a deposition ring 202 that surrounds the substrate support 106. The substrate support 106 along with the deposition ring 202 and the substrate 108 can be moved vertically independent of the cover ring 146 which remains in a stationary position. The cover ring 146 provides a shadow effect on a peripheral edge 204 of the substrate 108 from sputtering produced by the sputtering target 113. The cover ring 146 has an annular shape with a top surface 206 with an incline 214 that increases in a radially outward direction. The incline 214 can be from approximately 10 degrees to approximately 20 degrees from a plane 220 produced by a substrate supporting surface 208 of the substrate support 106. The incline 214 has an upper point 216 closest to the grounded shield 138 and a lower point 218 closest to the substrate support 106. The cover ring 146 has an outward protrusion 210 closest to the grounded shield 138 and an inward protrusion 212 that extends over the deposition ring 202.

Figure 3A:
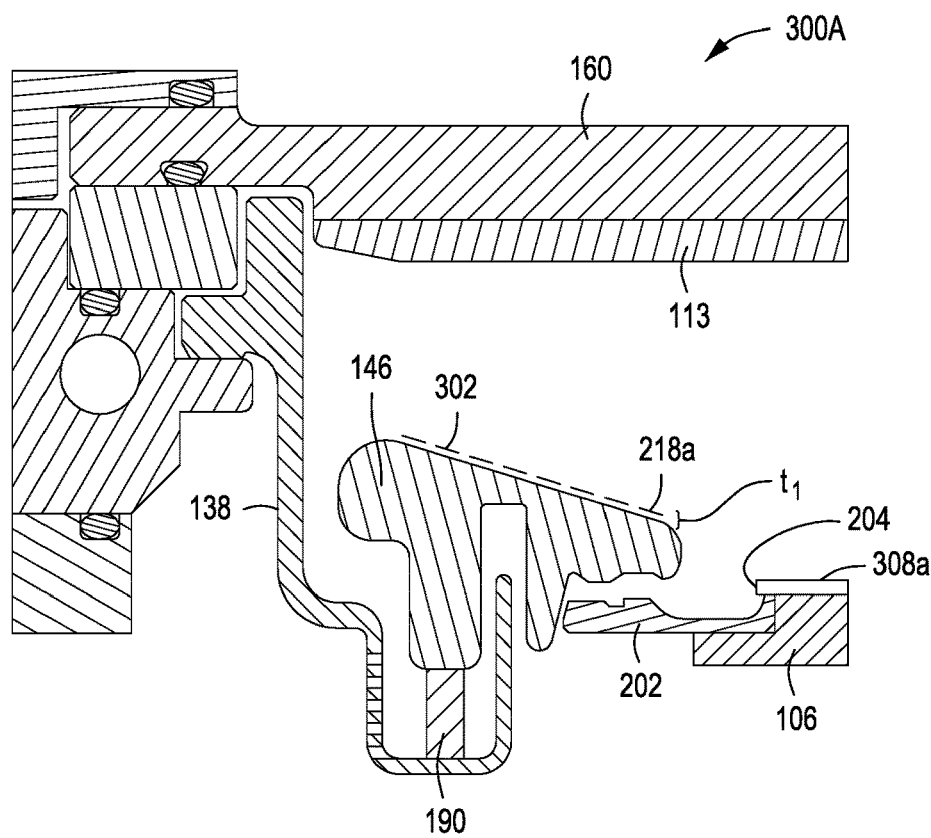
FIG. 3A depicts a first deposition layer formed on a cover ring during sputtering of a target in accordance with some embodiments of the present principles.

FIG. 3A is a partial schematic of a process chamber 300A after the sputtering target 113 has been sputtered on a first substrate 308a during a first sputtering process. Not only does the first substrate 308a have a deposition layer, but the first sputtering process has also formed a first deposition layer 302 on the top surface 206 of the cover ring 146. The first deposition layer 302 has a thickness $t_1$ that effectively increases the height of the lower point 218 of the incline 214 to a first raised lower point 218a. The cover ring 146 will now produce an increased shadow effect on a peripheral edge of a subsequent processed substrate.

Figure 3B:
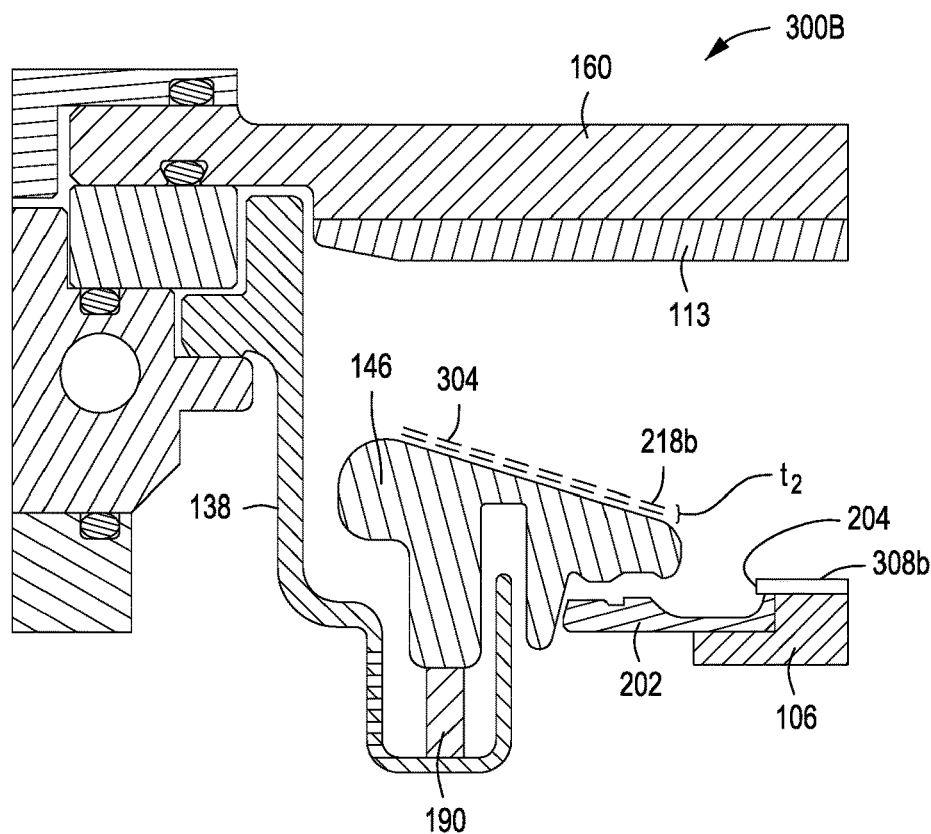
FIG. 3B depicts a second deposition layer formed on a cover ring during sputtering of a target in accordance with some embodiments of the present principles.

FIG. 3B is a partial schematic of a process chamber 300B after the sputtering target 113 has been sputtered on a second substrate 308b which is processed subsequent to the first substrate 308a. The first deposition layer 302 on the cover ring 146 has increased the shadow effect of the cover ring and will cause a thinning effect on the peripheral edge of the second substrate 308b during processing. After a second sputtering process, not only does the second substrate 308b have a deposition layer, but the second sputtering process has formed a second deposition layer 304 on the first deposition layer 302 on the top surface 206 of the cover ring 146. The second deposition layer 304 combined with the first deposition layer 302 has a thickness $t_2$ that effectively increases the height of the lower point 218 of the incline 214 even more to a second raised lower point 218b. The cover ring 146 now produces an increased shadow effect on the peripheral edge 204, leading to increased thinning of deposition material on substrates in subsequent processes. Each subsequent sputtering process causes increased deposits on the cover ring and further reduces the deposition edge thickness of each subsequent substrate.

Figure 4A:
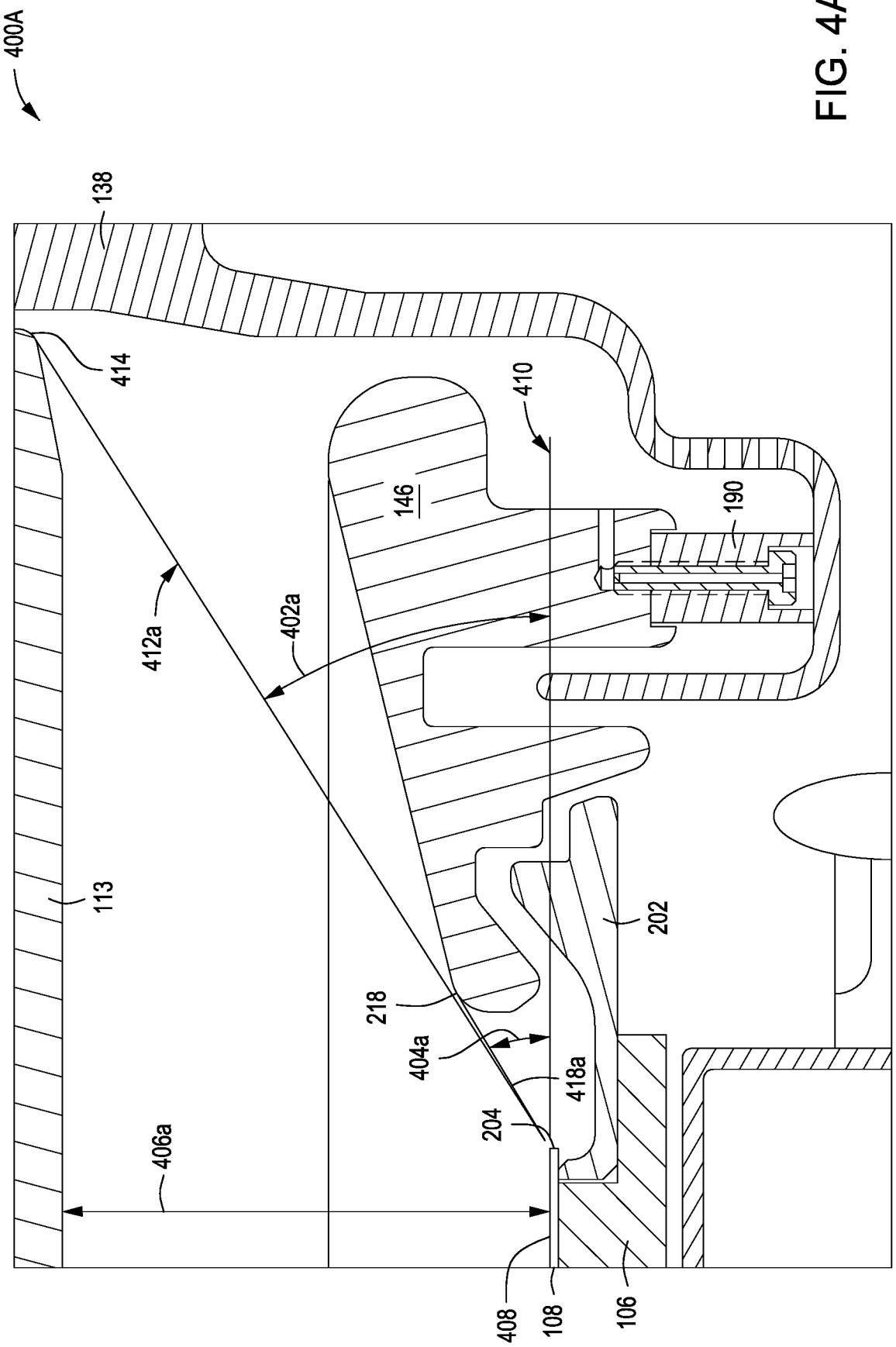
FIG. 4A depicts a first position of a substrate support and shadow effects from a cover ring on a peripheral edge of a substrate in accordance with some embodiments of the present principles.

FIG. 4A depicts a first position 400A of a substrate support 106 and a shadow effect from the cover ring 146 on the peripheral edge 204 of the substrate 108 in accordance with some embodiments. The sputtering target 113 is a first distance 406a from a top surface 408 of the substrate 108. A first line 412a drawn from the peripheral edge 204 of the substrate 108 to an edge 414 of the sputtering target 113 has a first angle 402a from a plane 410 parallel with the top surface 408 of the substrate 108. A first shadow line 418a drawn from the peripheral edge 204 of the substrate 108 to the lower point 218 of the cover ring 146 makes a first shadow angle 404a to the plane 410.

FIG. 4B depicts a second position 400B of a substrate support 106 and shadow effects from the cover ring 146 on the peripheral edge 204 of the substrate 108 in accordance with some embodiments. In FIG. 4B a deposition process has occurred and left a deposition layer 420 on the top surface of the cover ring 146, effectively increasing the height of the cover ring. To compensate for the increased height and to restore the shadow angle as shown in FIG. 4A, the substrate support 106 is vertically raised a given amount based on accumulated cover ring depositions. After compensation, the sputtering target 113 is a second distance 406b from the top surface 408 of the substrate 108. The second distance 406b of FIG. 4B is less than the first distance 406a in FIG. 4A. A second line 412b drawn from the peripheral edge 204 of the substrate 108 to the edge 414 of the sputtering target 113 has a second angle 402b from the plane 410 parallel with the top surface 408 of the substrate 108. The second angle 402b of FIG. 4B is less than the first angle 402a of FIG. 4A. A second shadow line 418b drawn from the peripheral edge 204 of the substrate 108 to a raised lower point 222 of the cover ring 146 makes a second shadow angle 404b to the plane 410. The second shadow angle 404b of FIG. 4B approximately equal to the first shadow angle 404a of FIG. 4A.

As the deposition layer 420 increases in thickness on the cover ring 146 of FIG. 4B, the lower point 218 of the cover ring 146 increases in height to a raised lower point, creating a larger and larger shadow angle relative to the peripheral edge 204 of the substrate 108. As the shadow angle increases, the increased shadow effect causes increased thinning of the deposition material on the peripheral edge region of the substrate 108. To maintain uniformity of the deposition on the peripheral edge region of the substrate 108, the first shadow angle 404a is approximately maintained during the life of the process kit. The shadow angle is maintained by raising the substrate support 106 along with the substrate 108 in a vertical direction upward to compensate for the increased cover ring deposits. The upward movement of the substrate support 106 compensates for the additional deposition material on the surface of the cover ring 146 and maintains the shadow effect of the cover ring 146. Adjustments to the vertical height of the substrate support can be made continuously during deposition, for each substrate, or for a number of substrates, etc.

Figure 5:
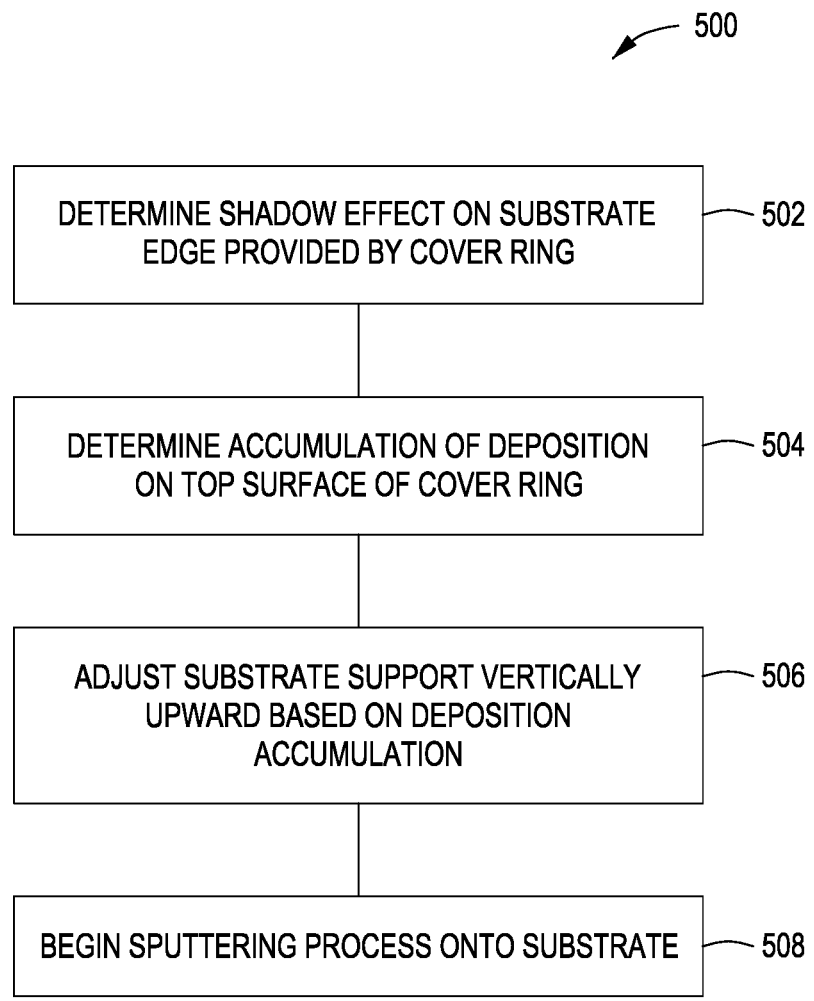
FIG. 5 is a method of controlling edge uniformity of a substrate in accordance with some embodiments of the present principles.

FIG. 5 is a method 500 of controlling edge uniformity in accordance with some embodiments. In block 502, a determination is made as to an extent of a shadow effect on a substrate provided by a cover ring. The shadow effect is typically known for a given process chamber based on the geometry of the process chamber and the process positions for a given process. As illustrated by FIGS. 4A and 4B, the shadow effect can be given in terms of a shadow angle that is defined, in part, by the height of the lower point of the cover ring over the plane of the substrate being processed and the distance between the peripheral edge of the substrate and the lower point of the cover ring. To maintain deposition uniformity of the peripheral edge of the substrate for a given process, the shadow effect should also be maintained. As deposition of material is increased on the top surface of the cover ring, the lower point of the cover ring increases in height over the peripheral edge of the substrate causing an increased shadow effect that reduces deposition on the edge of the substrate.

In block 504, a determination is made as to the extent of the accumulation of the deposition on the top surface of the cover ring. The accumulation can be measured directly from the top surface of the cover ring and/or determined based on parameters used during a process. The parameters can include, for example, the rate of deposition, type of deposition material, age of the sputter target, hours of operation, power used during the process, and others. In some embodiments, the kilowatt-hours are used as part of the deposition accumulation determination for the cover ring. For example, a sputter target may have a life span of approximately 3,000 kwh. Assuming the sputter target rate of deposition is approximately linear over the sputter target's life span, a total accumulation can be determined for the life of the sputter target. The total accumulation can then be used to compensate for the deposition on the cover ring based on the accumulation per kilowatt-hour.

In block 506, when the rate of deposition or determination of deposition is made, the substrate support can be adjusted vertically upward based on the deposition accumulation. In some embodiments, the substrate support is adjusted to compensate for the deposition accumulation continuously. In some embodiments, the substrate support is adjusted to compensate for the deposition accumulation after a substrate is processed. In some embodiments, the substrate support is adjusted to compensate for the deposition accumulation after a number of substrates are processed. The frequency of the adjustment of the shadow effect caused by the cover ring can also be dependent on the type of process being performed and the rate of deposition for the process. In some embodiments, the substrate support may be stationary and the cover ring may be adjusted vertically and/or horizontally to compensate for the deposition accumulation. Since the shadow angle formed by the cover ring is dependent on the height above the substrate surface and the distance from the substrate's edge, vertical and horizontal movement of either the cover ring or the substrate support can be used to adjust the shadow effect.

In block 508, after the adjustments to the shadow effect have been made, the sputtering process can begin on the substrate. In some embodiments, the adjustment of the shadow effect can be accomplished during the deposition process to compensate for deposition on the cover ring in real-time or near real-time. In some embodiments, control of the adjustments can come from the controller 194 discussed in FIG. 1. Software can be used based on an algorithm that includes parameters such as, for example, type of target material, size of the target material (e.g., to determine the shadow effect and/or life span of the target, etc.), hours of operation, and/or kilowatt-hours, etc.

The software may determine a frequency for adjustments based on deposition rate, type of process, type of target material, number of substrates, etc. In some embodiments, the controller 194 may receive feedback to further aid in compensating for the shadow effect. The feedback may include, for example, direct measurement of the deposition accumulation on the cover ring and/or other operational or manufacturing parameters and the like. The direct measurement can include, but is not limited to, measuring the thickness of the accumulation of the deposition and/or weighing the cover ring to determine how much accumulation has occurred. Based on prior processing and experiences, a lookup table can also be used to determine the extent of adjustments during deposition processes.

While the foregoing is directed to embodiments of the present principles, other and further embodiments of the principles may be devised without departing from the basic scope thereof.

The invention claimed is:

1. A method of controlling substrate edge uniformity in a semiconductor process chamber, comprising:
    depositing a first material on a first substrate disposed on a substrate support held in a first position relative to a cover ring disposed about the substrate support, the first position providing a shadow angle of the cover ring to the first substrate; and
    depositing the first material on a subsequent, second substrate with the substrate support in a second position relative to the cover ring, different than the first position, the second position maintaining the shadow angle of the cover ring for the second substrate, compensating for deposition on a top surface of the cover ring.

2. The method of claim 1, further comprising:
    vertically raising the substrate support to compensate for deposition on the top surface of the cover ring.

3. The method of claim 1, further comprising:
    determining a thickness of deposition on the top surface of the cover ring; and
    moving the substrate support in response to the thickness of deposition on the top surface of the cover ring.

4. The method of claim 3, further comprising:
    determining the thickness of deposition on the top surface of the cover ring by weighing the cover ring.

5. The method of claim 1, further comprising:
    determining, in kilowatt-hours, a usage of a sputtering target used in the semiconductor process chamber; and
    moving the substrate support in response to the kilowatt-hours of the usage of the sputtering target.

6. The method of claim 1, further comprising:
    moving the substrate support to compensate for deposition on the top surface of the cover ring after a substrate is processed.

7. The method of claim 1, further comprising:
    adjusting the substrate support based on a lookup table.

8. An apparatus for controlling substrate edge uniformity in a semiconductor process chamber, comprising:
    a substrate support with a top surface for holding a substrate when present; the substrate support being movable;
    a cover ring that engages with an electrically insulating spacer that engages with a grounded shield such that the cover ring is held stationary; and
    a controller that adjusts the substrate support in response to a deposition of material on a surface of the cover ring.

9. An apparatus for controlling substrate edge uniformity in a semiconductor process chamber, comprising:
    a substrate support with a top surface for holding a substrate when present; the substrate support being movable;
    a cover ring that engages with an electrically insulating spacer that engages with a grounded shield such that the cover ring is held stationary; and
    a controller that maintains a shadow effect of the cover ring on the substrate by adjusting the substrate support in response to deposition of material on a top surface of the cover ring.

10. The apparatus of claim 9, wherein the controller adjusts the substrate support upward in response to the deposition of material on the top surface of the cover ring based, at least in part, on a number of kilowatt-hours of usage of a sputtering target used in a deposition process.

11. The apparatus of claim 8, wherein the controller adjusts the substrate support in response to deposition of material on the surface of the cover ring based, at least in part, on a number of kilowatt-hours of usage of a sputtering target used in a deposition process.

12. An apparatus for controlling substrate edge uniformity in a semiconductor process chamber, comprising:
    a substrate support with a top surface for holding a substrate when present; the substrate support being movable;
    a cover ring that engages with an electrically insulating spacer that engages with a grounded shield such that the cover ring is held stationary; and
    a controller that maintains a shadow effect of the cover ring on the substrate by adjusting the substrate support in response to an increase in weight of the cover ring.

13. The apparatus of claim 8, wherein an adjustment of the substrate support controls deposition uniformity on the peripheral edge.

14. The apparatus of claim 8, wherein the controller adjusts the substrate support after a substrate is processed.

15. A system for controlling substrate edge uniformity in a semiconductor process chamber, comprising:
    a process volume in the semiconductor process chamber;
    a shield surrounding the process volume and electrically grounded;
    a substrate support with a top surface for holding a substrate when present; the substrate support being movable;
    a deposition ring surrounding the substrate support;
    a cover ring that engages with an electrically insulating spacer that engages with the shield such that the cover ring is held stationary, the cover ring is isolated from the deposition ring and electrically isolated from the shield; and a controller that adjusts the substrate support in response to a deposition of material on a surface of the cover ring.

16. The system of claim 15, wherein the cover ring forms a shadow effect on a periphery edge of the substrate when present.

17. The system of claim 16, wherein the controller adjusts the substrate support to maintain the shadow effect when deposition on a top surface of the cover ring increases the shadow effect of the cover ring.

18. The system of claim 15, wherein the deposition ring does not engage with the cover ring during deposition.

19. The system of claim 15, wherein the electrically insulating spacer engages with a u-shaped portion of the shield.

20. The system of claim 15, wherein the controller continually adjusts the substrate support in response to the deposition of material on the surface of the cover ring.

* * * * *